(12) United States Patent
Chu et al.

(10) Patent No.: US 8,519,772 B2
(45) Date of Patent: Aug. 27, 2013

(54) ALTERNATE POWER GATING ENABLEMENT

(75) Inventors: Albert M. Chu, Essex Junction, VT (US); Daryl M. Seitzer, Essex Junction, VT (US); Rohit Shetty, Essex Junction, VT (US); Douglas W. Stout, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 217 days.

(21) Appl. No.: 13/075,652

(22) Filed: Mar. 30, 2011

(65) Prior Publication Data

US 2012/0249213 A1    Oct. 4, 2012

(51) Int. Cl.
    *H03K 17/687* (2006.01)
(52) U.S. Cl.
    USPC ............ 327/434; 327/388; 327/427; 327/387
(58) Field of Classification Search
    USPC .......................................... 323/908; 327/530
    See application file for complete search history.

(56) References Cited

U.S. PATENT DOCUMENTS

| | | | |
|---|---|---|---|
| 6,255,853 B1 | 7/2001 | Houston | |
| 6,624,487 B1 | 9/2003 | Kunz et al. | |
| 6,876,252 B2* | 4/2005 | Kim et al. | 327/544 |
| 7,046,063 B2 | 5/2006 | Kuang et al. | |
| 7,266,707 B2 | 9/2007 | Ngo et al. | |
| 7,276,932 B2* | 10/2007 | Kuang et al. | 326/33 |
| 7,436,201 B2 | 10/2008 | Kumar | |
| 7,659,746 B2 | 2/2010 | Chua-Eoan et al. | |
| 7,723,867 B2* | 5/2010 | Willingham et al. | 307/80 |
| 7,956,677 B2* | 6/2011 | Igarashi et al. | 327/544 |
| 2003/0184364 A1* | 10/2003 | Miyagi | 327/544 |
| 2009/0115256 A1* | 5/2009 | Flynn et al. | 307/115 |
| 2010/0219866 A1* | 9/2010 | Chen | 327/143 |
| 2010/0259200 A1* | 10/2010 | Beausoleil | 315/320 |
| 2010/0307840 A1* | 12/2010 | Kobayashi et al. | 178/18.06 |
| 2011/0078476 A1* | 3/2011 | Han | 713/320 |
| 2012/0223778 A1* | 9/2012 | Shin et al. | 331/34 |

OTHER PUBLICATIONS

Abella, J. et al., "Penelope: The NBTI-Aware Processor", 40th IEEE/ACM International Symposium on Microarchitecture, MICRO, 2007, pp. 85-96.
Shin, Y. et al., "Power Gating: Circuits, Design Methodologies . . . ", ACM Transactions on Design Automation of Electronic Systems, vol. 15, No. 4, Sep. 2010, Art. 28, 37 pages.
Zhang, W. et al., "Compiler Support for Reducing Leakage Energy . . . ", Proceedings of the Design, Automation and Test in Europe Conference and Exhibition, 2003, pp. 1146-1147.

* cited by examiner

*Primary Examiner* — Ryan Jager
(74) *Attorney, Agent, or Firm* — David Cain; Roberts Mlotkowski Safran & Cole, P.C.

(57) ABSTRACT

Structures and methods for implementing alternating power gating in integrated circuits. A semiconductor structure includes a power gated circuit including a group of power gate switches and an alternating enable generator that generates enabling signals. Each respective one of the power gate switches is enabled by a respective one of the enabling signals. The alternating generator generates the enabling signals such that a first enabled power gate switch is alternated amongst the group of power gate switches.

18 Claims, 9 Drawing Sheets

First Gate T0 >> 7% Current Spike compared to T1 (For Gate T0, Integration of current over time = 16% more than T1)
Second Gate T1 >> 5% current spike compared to T2 (For Gate T1, Integration of current over time = 14% more than T2)
Third Gate T2 >> 3% current Spike compared to T3 (For Gate T2, Integration of current over time = 10% more than T3)

ALTERNATE POWER GATING ENABLEMENT

FIELD OF THE INVENTION

The invention relates to integrated circuits and, more particularly, to structures and methods for implementing alternating power gating in integrated circuits.

BACKGROUND

As integrated circuits become smaller, leakage power is becoming an increasing ratio of the total power, and ways to lessen its impact are needed. For example, as devices are made smaller, the power supply voltage may be correspondingly reduced. However, this may not achieve an adequate reduction in leakage power dissipation. Instead, alternative techniques are employed to reduce leakage power. One of those techniques employed is to use power gating to isolate the power supply voltage in groups of circuits at controlled times. The power gated circuits are used to control power such that the entire integrated circuit is not turned on at one time, and rather the power can be channeled to a predetermined area of the integrated circuit. However, turning on the power gated circuits can result in a rush of current causing an IR drop issue, which is essentially a voltage drop on the global power supply due to a flow of current (I) through a length of metal exhibiting resistance (R).

One technique employed to overcome this issue in power gated circuits is to daisy chain the power gate cells with delayed enable signals or grouping power gate cells with staged enable signals. An issue with these configurations is that the first cells in the chain or the first group of cells to be enabled are subjected to more sustained current rush and after many power gating cycles these cells become predisposed to electromigration failure.

Accordingly, there exists a need in the art to overcome the deficiencies and limitations described hereinabove.

SUMMARY

In a first aspect of the invention, a semiconductor structure includes a power gated circuit that comprises a group of power gate switches and an alternating enable generator that generates enabling signals. Each respective one of the power gate switches is enabled by a respective one of the enabling signals. The alternating generator generates the enabling signals such that a first enabled power gate switch is alternated amongst the group of power gate switches.

In another aspect of the invention, a power gated cell circuit includes a global power supply, at least one group of power gate switches connected to the global power supply, and an internal power supply bus connected to the at least one group of power gate switches. The power gated cell circuit further includes an alternating enable generator including a counter. The counter receives a gate enable signal indicative of each power-on cycle of the power gated cell circuit, and outputs a counter signal. The alternating enable generator further includes a demultiplexer. The demultiplexer receives the counter signal and the gate enable signal, and outputs a group of demultiplexer signals, and a different one of the demultiplexer signals in the group of demultiplexer signals is output as a high signal for each power-on cycle based on the counter signal and the gate enable signal received. The alternating enable generator further includes alternate logic connected to the at least one group of power gate switches. The alternate logic receives the group of demultiplexer signals and the gate enable signal, and outputs a group of enabling signals to the at least one group of power gate switches, and a different one of the enabling signals of the group of enabling signals is output first based on the different one of the demultiplexer signals output as the high signal and the gate enable signal received. The power gated cell circuit further includes a first power gate switch of the at least one group of power gate switches that is enabled first based on the different one of the enabling signals that is output first, and the first power gate switch is alternated for each power-on cycle based on a combination of the counter signal and the gate enable signal.

In yet another aspect of the invention, a method is provided for controlling alternate power gating, including outputting enabling signals such that each power gate switch of a group of power gate switches is enabled by a different enabling signal. The method further includes receiving the enabling signals such that a different power gate switch of the group of power gate switches is enabled first after each power-on cycle of a power gate cell circuit.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a power gating cell circuit, which comprises the structures of the present invention. In still further embodiments, a method in a computer-aided design system is provided for generating a functional design model of the power gating cell circuit. The method comprises generating a functional representation of the structural elements of the power gating cell circuit.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuits and, more particularly, to structures and methods for implementing alternating power gating in integrated circuits. More specifically, implementations of the invention provide various control circuits that alternate the order that grouped power gate cells are enabled. In embodiments, logic uses count information from a counter to provide an alternating start point for which the grouped power gate cells are enabled. Advantageously, structures in accordance with aspects of the present invention are capable of avoiding a same power gate cell or same group of power gate cells being repeatedly the first power gate cell or first group of power gate cells to be enabled and subjected to the current rush, compared to conventional devices. This protects the power gate cells from becoming predisposed to electromigration failure.

Figure 1:
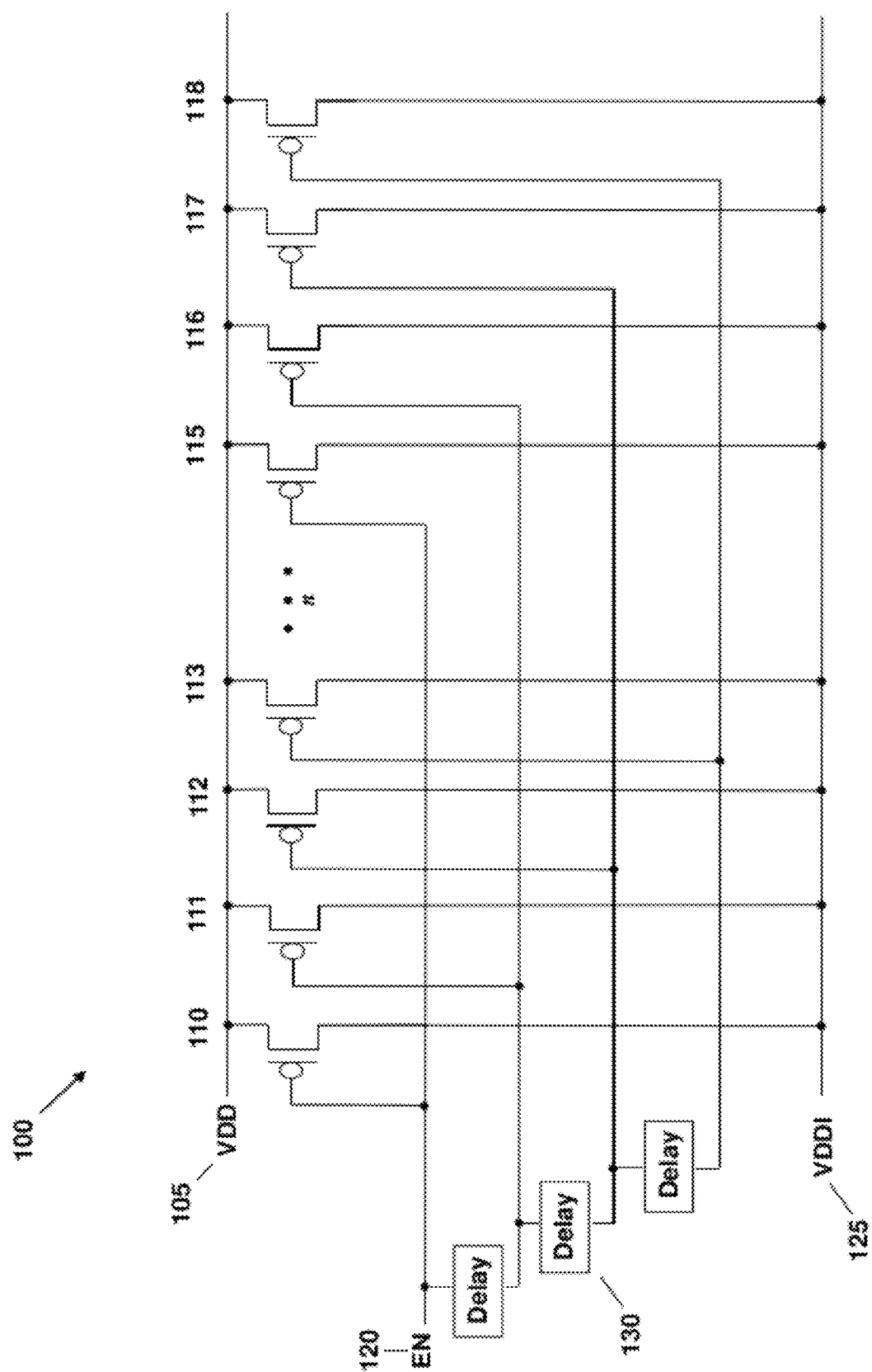
FIG. 1 shows a grouped power gating cell scheme.

FIG. 1 shows a grouped power gating cell scheme 100. The grouped power gating cell scheme 100 includes a global power supply (VDD) 105, a first group of power gate switches 110, 111, 112, and 113, a second group of power gate switches 115, 116, 117, and 118, an enabling signal 120, and an internal power supply bus (VDDI) 125. The enabling signal 120 first turns on the switches 110 and 115 enabling the VDD 105 to travel through the open switches 110 and 115 to the VDDI 125. Subsequently in a serial relationship, a delay 130 causes the enabling signal 120 to turn on switches 111 and 116 a predetermined amount of time after turning on switches 110 and 115, turn on switches 112 and 117 a predetermined amount of time after turning on switches 111 and 116, and turn on switches 113 and 118 a predetermined amount of time after turning on switches 112 and 117. Therefore, as evident from the grouped power gating cell scheme 100, the power gate switches 110 and 115 are always the first power gate cells to be enabled and subjected to the current rush.

Figure 2:
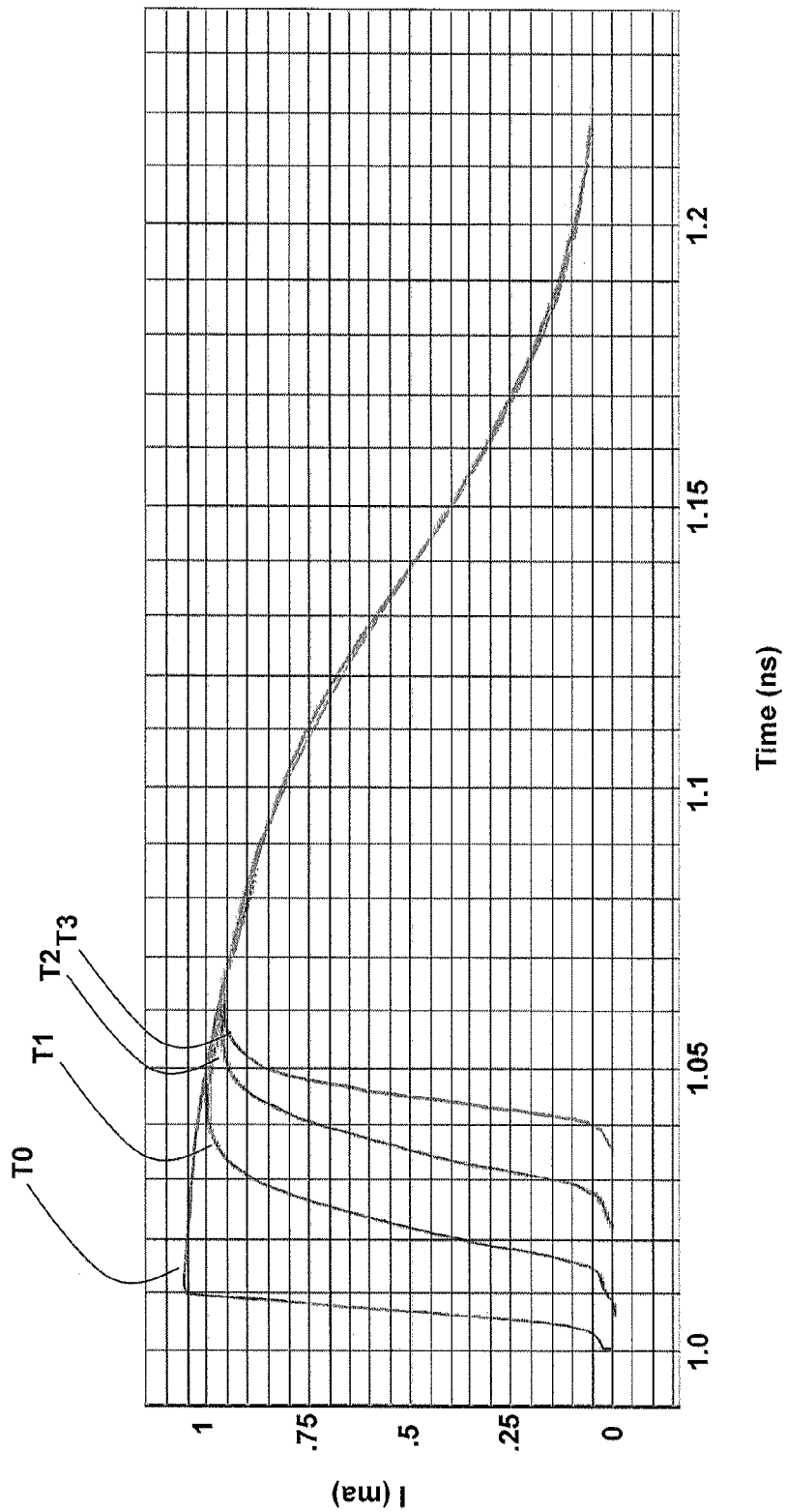
FIG. 2 shows a graph representative of power gating cell currents for switches over a period of time.

FIG. 2 shows the total current and power gating cell currents for switches 110-113 (as described previously in FIG. 1). The line T0 on the graph represents the current/time for the power gate switch 110. As evident from this graph, the switch 110 receives more current, e.g., a current rush, than power gate switches 111-113 represented by lines T1-T3. Thus, because the power gate switch 110 is always the first power gate cell to be enabled, the power gate switch 110 is susceptible to degrade faster over a period of time, and ultimately may cause electromigration failure of the power gate cells.

Figure 3:
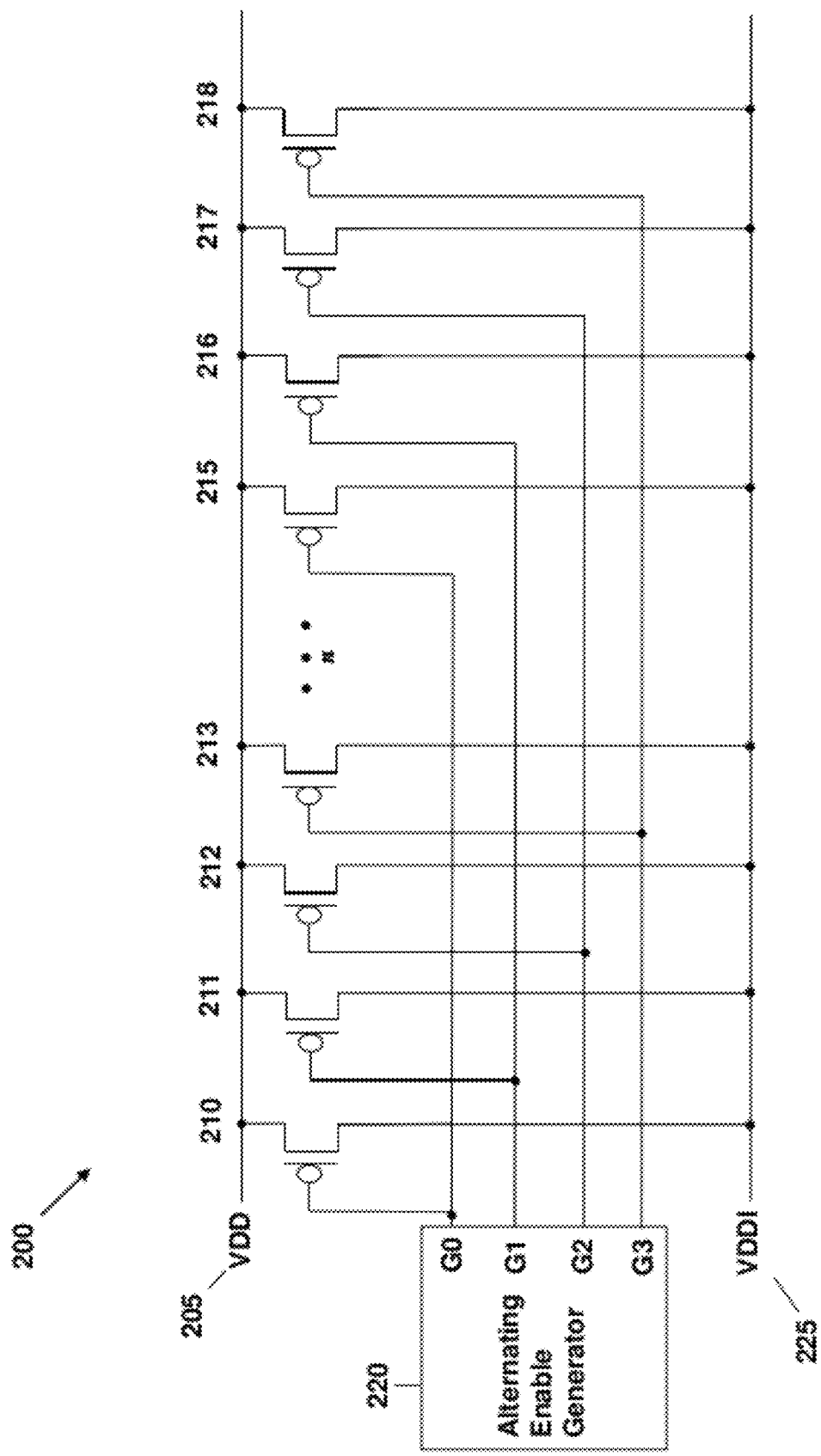
FIG. 3 shows an exemplary grouped power gating cell circuit in accordance with aspects of the invention.

FIG. 3 shows an exemplary grouped power gating cell circuit 200 implemented with hardware in accordance with aspects of the invention. In embodiments, the grouped power gating cell circuit 200 includes a global power supply (VDD) 205, a first group of power gate switches 210, 211, 212, and 213, a second group of power gate switches 215, 216, 217, and 218, an alternating enable generator 220, and an internal power supply bus (VDDI) 225. The number of groups of power switches and the number of power switches in each group is not limited to any specific number, and the two groups shown in FIG. 3 are for purposes of simply illustrating the invention; however any desired number of groups and number of power switches per group may be used within the scope of the invention.

In embodiments, each time the system is turned on, the alternating enable generator 220 alternates which enabling signal G0, G1, G2, or G3 is generated first and consequently alternates which switches (210, 215), (211, 216), (212, 217), or (213, 218) are enabled first. For example, the alternating enable generator 220 may enable G0 prior to G1, G2, and G3 when the system is powered on the first time. Then, the alternating enable generator 220 enables G1 prior to G0, G2, and G3 when the system is powered on a second time. Then, the alternating enable generator 220 enables G2 prior to G0, G1, and G3 when the system is powered on a third time. Then, the alternating enable generator 220 enables G3 prior to G0, G1, and G2 when the system is powered on a fourth time. Thus, because the grouped power gating cell circuit 200 alternates which of the power gate switches (210, 215), (211, 216), (212, 217), or (213, 218) is enabled first, the power gate switches (210, 215), (211, 216), (212, 217), or (213, 218) are not susceptible to any increased degradation over a period of time, and ultimately the grouped power gating cell scheme 200 prevents electromigration failure of the power gate cells.

Figure 4:
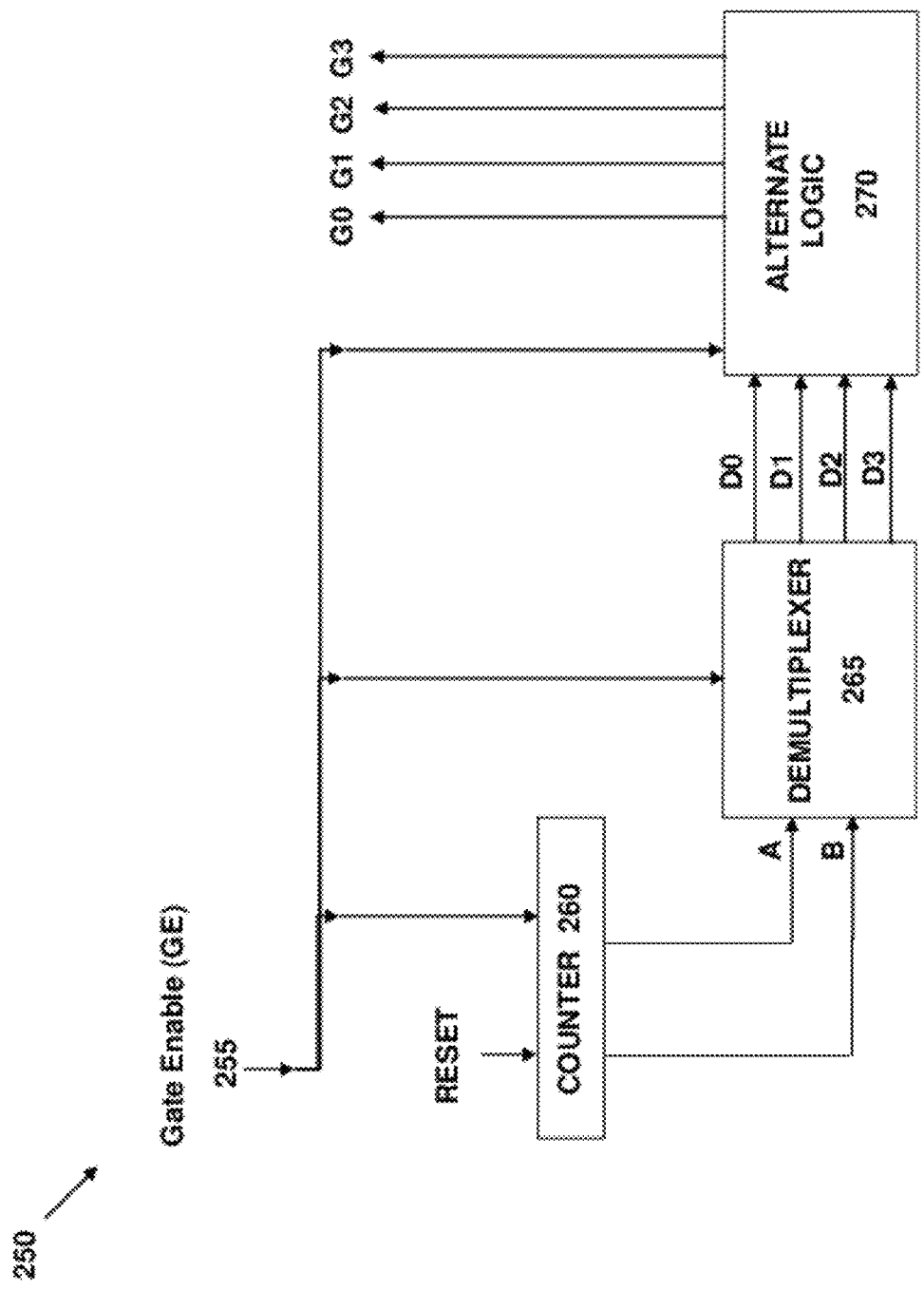
FIG. 4 shows an exemplary block diagram for an alternate gating structure in accordance with aspects of the invention.

FIG. 4 shows an exemplary block diagram 250 for an alternate gating structure in accordance with aspects of the invention. For example, FIG. 4 illustrates logic that may be comprised inside the alternating enable generator 220 (as described previously in FIG. 3). In embodiments, the logic in block diagram 250 provides the functionality of alternating which of the enabling signals G0-G4 is the first enabled each time the power gating cell circuit 200 (as described in FIG. 3) is powered on. In embodiments, each time the power gating cell circuit 200 is powered on during operation of an integrated circuit, a gate enable signal (GE) 255 is generated for each power gate sequence start, which is provided to a counter 260, a demultiplexer 265, and alternate logic 270.

For example, the counter 260 may be a 2 bit counter and upon receipt of the gate enable signal 255 the counter 260 sends a count signal (A, B) to the demultiplexer 265. In embodiments, the demultiplexer 265 uses the 2 bit count signal (A, B) to generate first, second, third, and fourth demultiplexer signals D0, D1, D2, and D3, which are provided to the alternate logic 270. The demultiplexer 265 is described in greater detail below with respect to FIG. 5.

In accordance with aspects of the invention, the alternate logic 270 converts the demultiplexer signals D0, D1, D2, and D3 into enabling signals G0, G1, G2, and G3, which are provided to enable the power gate switches. The alternate logic 270 is described in greater detail below with respect to FIG. 6. As evident by the block diagram 250, each gate enable signal (GE) 255 causes the generation of a first, second, third, and fourth demultiplexer signals D0, D1, D2, and D3 and corresponding enabling signals G0, G1, G2, and G3. However, the number of signals is not limited to any specific number, and the four shown in FIG. 4 are for purposes of simply illustrating the invention.

Figure 5:
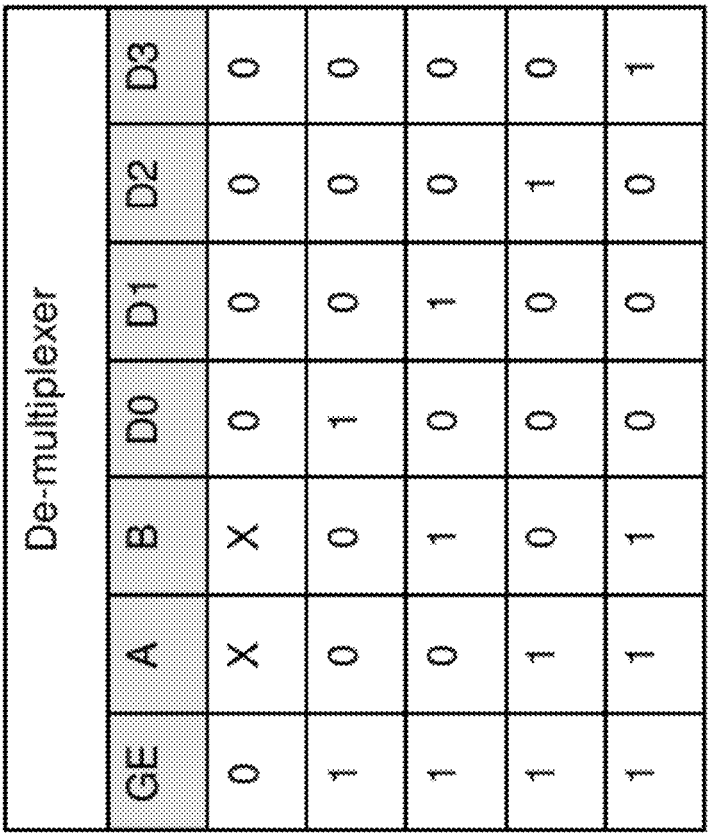
FIG. 5 shows an exemplary logic diagram and truth table for the de-multiplexer used in accordance with aspects of the invention.
Figure 5:
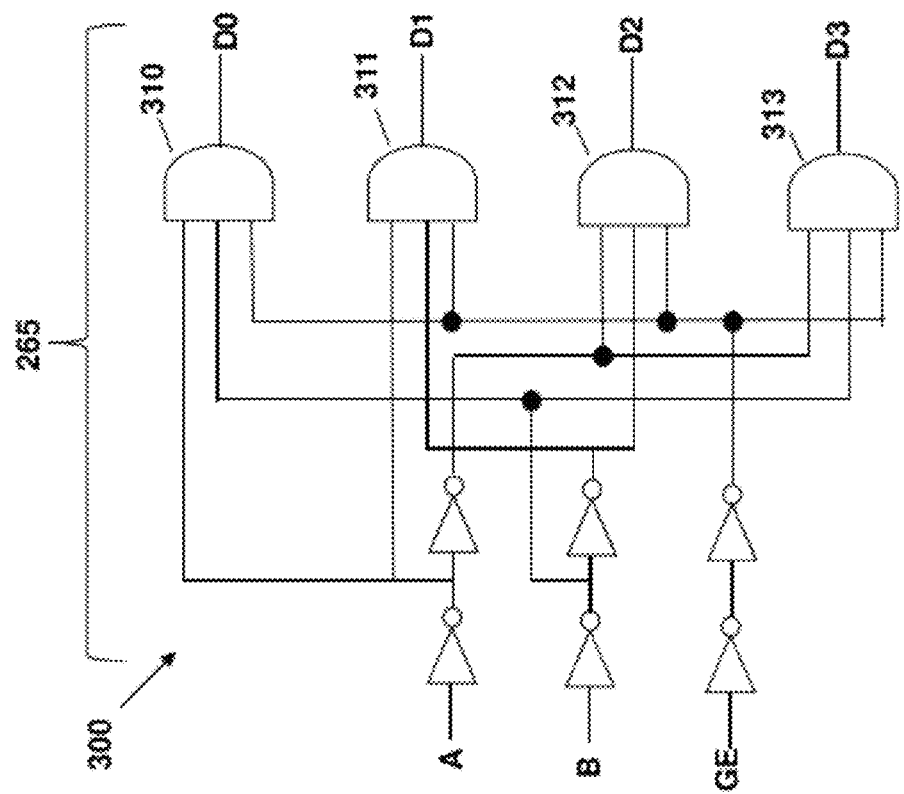

FIG. 5 shows an exemplary logic diagram 300 and truth table 400 implemented with hardware in accordance with aspects of the invention. For example, FIG. 5 illustrates the structure and logic comprised inside the demultiplexer 265 (as described previously in FIG. 4). The demultiplexer 265 comprises a plurality of gates (310-313) based on the number of enabling signals that the alternate logic 270 (as described previously in FIG. 4) is set up to generate. As shown in the logic diagram 300, the demultiplexer 265 receives the 2 bit count signal (A, B) from the counter 260 and receives the gate enable single (GE) 255 from the power gate sequence start (as described previously in FIG. 4). The gates 310-313 process the 2 bit count signal (A,B) and the gate enable signal (GE), and generate the first, second, third, and fourth demultiplexer signals D0, D1, D2, and D3, as defined in the truth table 400. The demultiplexer signals D0, D1, D2, and D3 are sent to the alternate logic 270 (as described previously in FIG. 4).

As illustrated in the truth table 400, a first power-on cycle generates the first gate enable signal GE and the counter 260 generates a first 2 bit count signal (A,B). The "1" in the GE column being indicative of a high output, and the "0" for the A column and the B column being indicative of a low output. The first gate enable signal GE and the first 2 bit count signal (A=0,B=0), cause the demultiplexer 265 to generate a first set of demultiplexer signals D0, D1, D2, and D3. The "1" in the D0 column being indicative of a high output, and the "0" in the D1-D3 columns being indicative of a low output.

Thereafter, in the event of a second power-on cycle, the counter 260 generates a second 2 bit count signal (A=0,B=1) in which the A signal is a low output and the B signal is a high output. The second 2 bit count signal (A,B) in combination with the second gate enable signal GE causes the demultiplexer 265 to generate a second set of demultiplexer signals D0, D1, D2, and D3 such that D1 is the only high output. In the event a third power-on cycle occurs, the counter 260 generates a third 2 bit count signal (A,B) in which the A signal is a high output and the B signal is a low output. The third 2 bit count signal (A,B) in combination with the third gate enable signal GE causes the demultiplexer 265 to generate a third set of demultiplexer signals D0, D1, D2, and D3 such that D2 is the only high output. In the event a fourth power-on cycle occurs, the counter 260 generates a fourth 2 bit count signal (A,B) in which the A signal is a high output and the B signal is a low output. The fourth 2 bit count signal (A,B) in combination with the fourth gate enable signal GE causes the demultiplexer 265 to generate a fourth set of demultiplexer signals D0, D1, D2, and D3 such that D3 is the only high output. As evident from the truth table 400, the demultiplexer 265 alternates which demultiplexer signal D0, D1, D2, or D3 is the high output for each power-on cycle.

Figure 6:
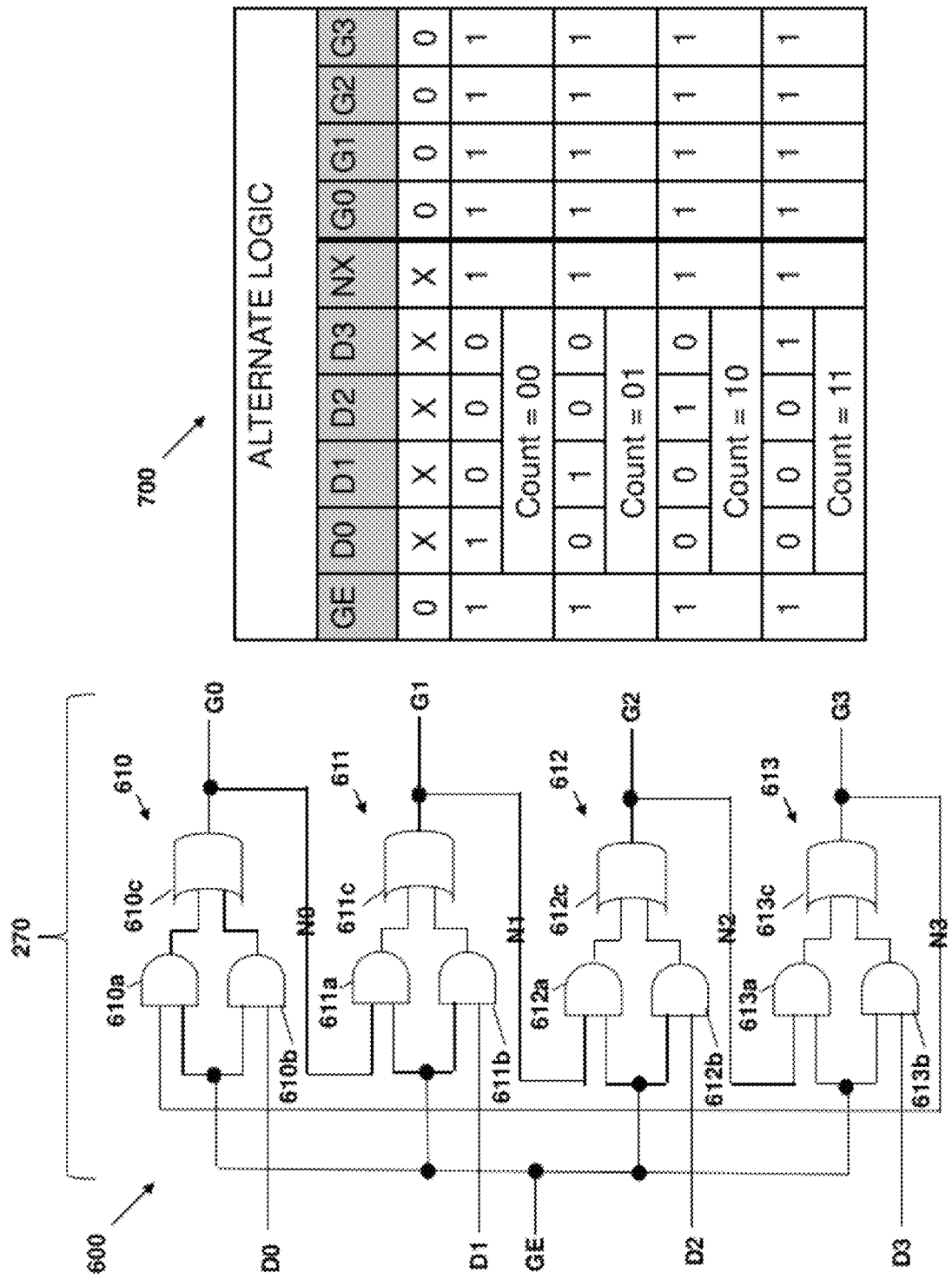
FIG. 6 shows an exemplary logic diagram and truth table for alternating gate enablement in accordance with aspects of the invention.

FIG. 6 shows an exemplary logic diagram 600 and truth table 700 implemented with hardware in accordance with aspects of the invention. The logic diagram 600 represents logic that may be comprised in alternate logic 270 (as described previously in FIG. 4), and comprises a plurality of gates that are grouped (610-613) based on the number of enabling signals that the alternate logic 270 is set up to generate. The respective groups of gates (610-613) receive the gate enable signal GE and the demultiplexer signals D0, D1, D2, and D3 (as described in FIGS. 4 and 5) as inputs. Each group of gates (610-613) comprises two AND gates (e.g., 610*a* and 610*b*) and one OR gate (e.g., 610*c*). The AND gates generate a high output if both inputs are high, and the OR gates generate a high output if any one input or both inputs are high.

As illustrated in the truth table 700, a first power-on cycle generates the first gate enable signal GE. The "0" in the GE column being indicative of a low output, and the "1" being indicative of a high output. The first gate enable signal GE causes the demultiplexer 265 (as described previously with regard to FIGS. 4 and 5) to generate the first, second, third and fourth demultiplexer signals D0, D1, D2 and D3. The "1" in the D0-D3 columns being indicative of a high output, and the "0" in the D0-D3 columns being indicative of a low output. The first, second, third and fourth demultiplexer signals D0, D1, D2 and D3 cause the alternate logic 270 to generate the first, second, third and fourth enable signals G0, G1, G2 and G3. The "1" in the G0-G3 columns being indicative of a high output, and the "0" in the G0-G3 columns being indicative of a low output.

For example, with reference to the logic diagram 600 and the truth table 700, the first group of gates 610 receive the gate enable signal GE at the AND gates 610*a* and 610*b* as a low input when GE is "0." Thus, because the AND gates 610*a* and 610*b* only generate high output if both inputs are high, the first group of gates 610 is maintained off when the gate enable signal GE is low. However, when the gate enable signal GE is high or "1" in the first instance of truth table 700, the first group of gates 610 receives the gate enable signal GE at the AND gate 610*a* and 610*b* as high input. Further, the first group of gates 610 receives the D0 signal as a high output or "1" at the AND gate 610*b*, from the demultiplexer 265. The NX signal in this instance of a first power-on cycle will be indicative of low output.

Therefore, the AND gate 610*a* receives a low input from signal NX and a high input from the gate enable signal GE, and outputs a low output since both inputs are not high. The AND gate 610*b* receives a high output from the D0 signal and the gate enable signal GE, and outputs a high output since both inputs are high. The OR gate 610*c* receives the low output from the AND gate 610*a* and the high output from the AND gate 610*b* and outputs a high output since at least one of the inputs is high. Consequently, the enabling signal G0 is generated and sent to the first power gate switch or first group of power gate switches, and the high output of the OR gate 610*c* is used as a signal NO to cause the cascading effect illustrated in the waveform 800 described in detail below. Whereby each subsequent power gate switch or group of power gate switches are enabled by a delay from the preceding power gate switch or group of power gate switches.

Moreover, as evident from the logic diagram 600 and the truth table 700, the second time the gate enable signal GE is received, which is indicative of a second power-on cycle, the demultiplexer 265 generates the first, second, third and fourth demultiplexer signals D0, D1, D2 and D3 such that the D1 signal is the only high signal. This results in the second group of gates 611 generating enabling signal G1 first. Thus, the second power gate switch or second group of power gate switches is enabled first.

Advantageously, because in operation the logic diagram 600 alternates which of the power gate switches is enabled first upon a new power-on cycle, the power gate switches are not susceptible to degrade faster over a period of time, and ultimately the logic diagram 600 aids in preventing electromigration failure of the power gate cells.

Figure 7:
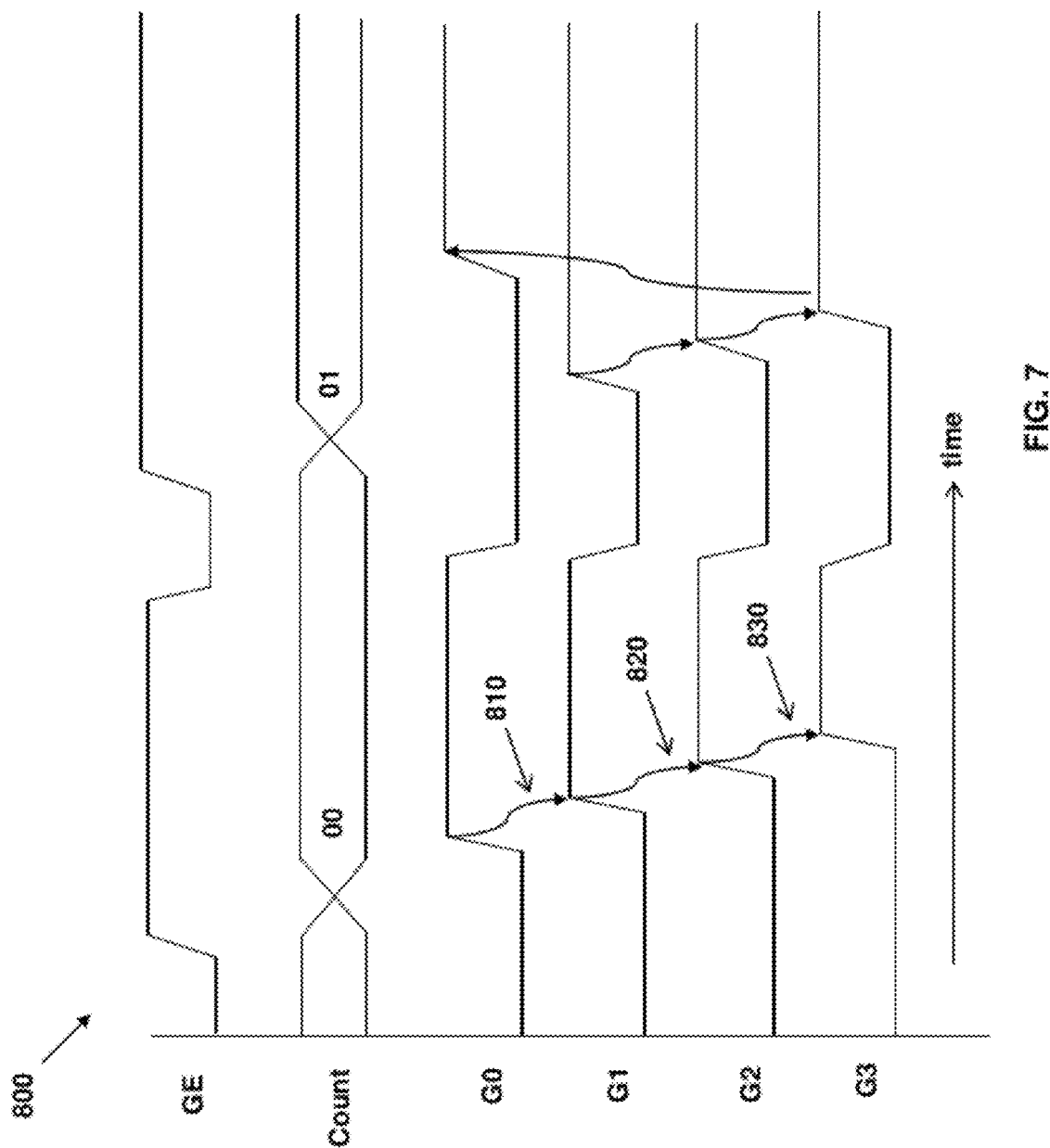
FIG. 7 shows an exemplary waveform for alternating gate enablement in accordance with aspects of the invention.

FIG. 7 shows an exemplary waveform 800 for alternating gate enablement in accordance with aspects of the invention. In embodiments, during operation of an integrated circuit, as described herein, the gate enable signal GE is generated for each power gate sequence start. The first gate enable signal GE causes the first count signal (0, 0) to be generated. The first count signal (0, 0) causes a cascading effect to occur, wherein the enabling signal G0 is generated first, the output of the enabling signal G0 subsequently causes the enabling signal G1 to enable the second switch, as represented by arrow 810, the output of the enabling signal G1 subsequently causes the enabling signal G2 to enable the third switch, as represented by arrow 820, and the output of the enabling signal G2 subsequently causes the enabling signal G3 to enable the fourth switch, as represented by arrow 830.

Thereafter, the second gate enable signal GE causes the second count signal (0, 1) to be generated, the second count signal (0, 1) causes another cascading effect to occur between the enabling signals G0-G3 and the first-fourth switches. However, in the instance of the second gate enable signal GE, the second count signal (0, 1) causes the enabling signal G1 to be generated first, which subsequently enables the second switch first and eventually in a serial manner enables the first switch last, as depicted previously the truth table 700.

Figure 8:
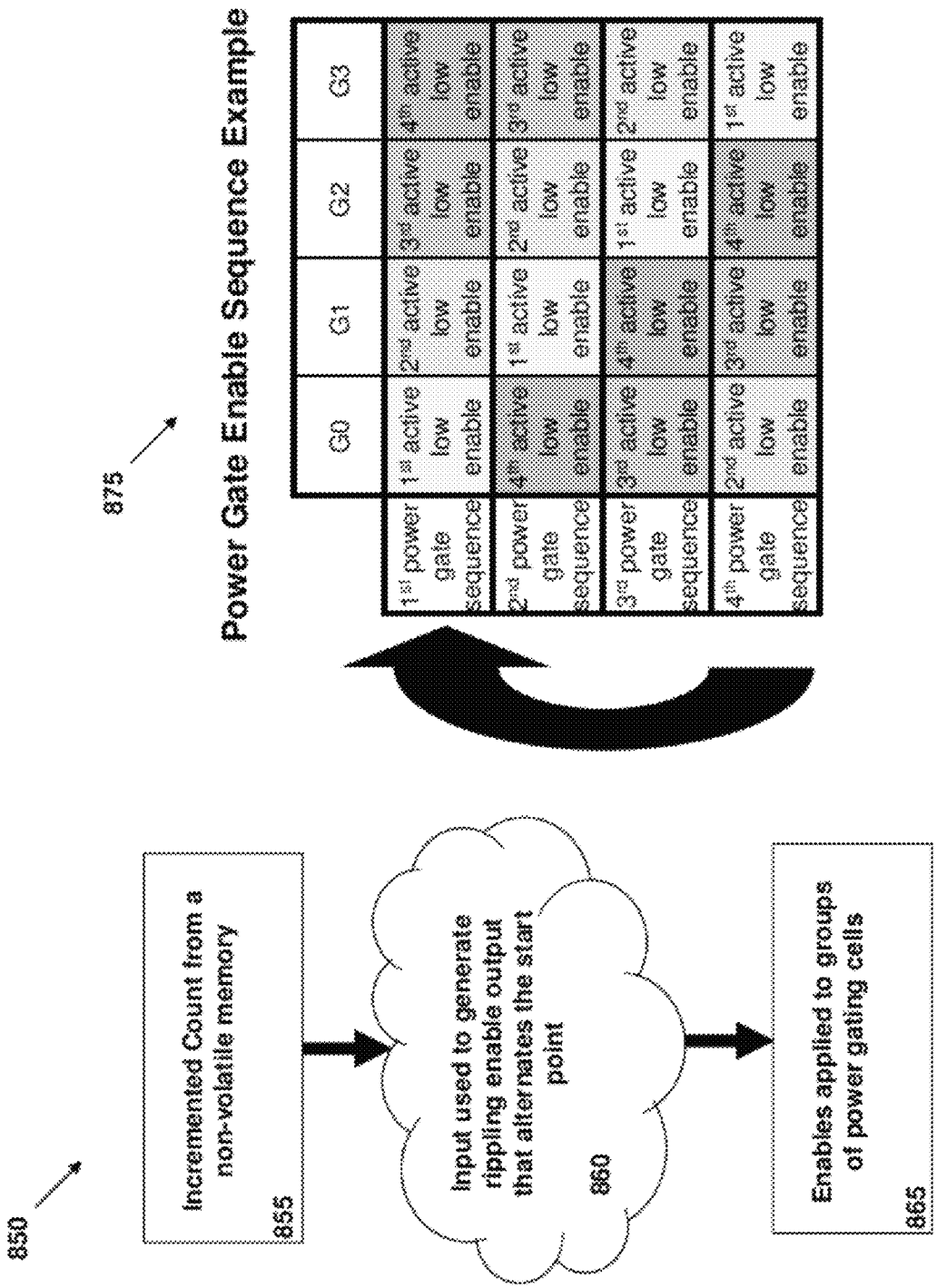
FIG. 8 shows an exemplary method and truth table for alternating gate enablement in accordance with aspects of the invention.

FIG. 8 shows exemplary method 850 and truth table 875 for alternating gate enablement in accordance with aspects of the invention. At step 855, the counter 260 (as described previously in FIG. 4) counts power-on cycles, e.g., power gate sequence starts, and increments a count stored in a non-volatile memory for each power-on cycle that occurs upon receipt of the gate enable signal GE. At step 860, the alternate logic 270 (as described previously in FIG. 4) uses rippled enable output from the demultiplexer 265 (as described previously with regard to FIGS. 4 and 5) to generate the corresponding enabling signals G0, G1, G2, and G3 that alternate a start point at which the power gate sequence starts. At step 865, the enabling signals G0, G1, G2, or G3 alternate which switches (210, 215), (211, 216), (212, 217), or (213, 218) (as described previously in FIG. 3) are enabled first, e.g., the start point.

As can be seen in the truth table 875, in embodiments the first power-on cycle, e.g., the first power gate sequence start, the counter is at "0" and the alternate logic 270 generates enabling signal G0 to enable the first group of switches (210, 215) first. Subsequently, the alternate logic 270 serially generates enabling signals G1, G2, and G3 to enable the second through fourth group of switches (211, 216), (212, 217), and (213, 218) respectively. Once the first power on-cycle is completed, the counter 260 increments the count to "1," and in the second power-on cycle, e.g., the second power gate sequence start, the alternate logic 270 generates enabling signal G1 to enable the second group of switches (211, 216) first. Subsequently, the logic serially generates enabling signals G2, G3, and G0 to enable the third through first group of switches (212, 217), (213, 218), and (210, 215) respectively.

As evident by the truth table 875, in the second power-on cycle the first group of switches (110, 115), which were previously enabled first in the first power-on cycle, are now enabled fourth in the second power-on cycle. Accordingly, as subsequent power-on cycles occur, the counter 260 increments the count, the alternate logic 270 generates enabling signals based on the count, and the first group of switches enabled are alternated. Therefore, for every four power gate sequences, each group of switches (210, 215), (211, 216), (212, 217), or (213, 218) are only enabled first once. As evident from FIG. 8, the order in which the switches are enabled is not limited to the order illustrated in the truth table 875, and the order can be reversed for example.

Figure 9:
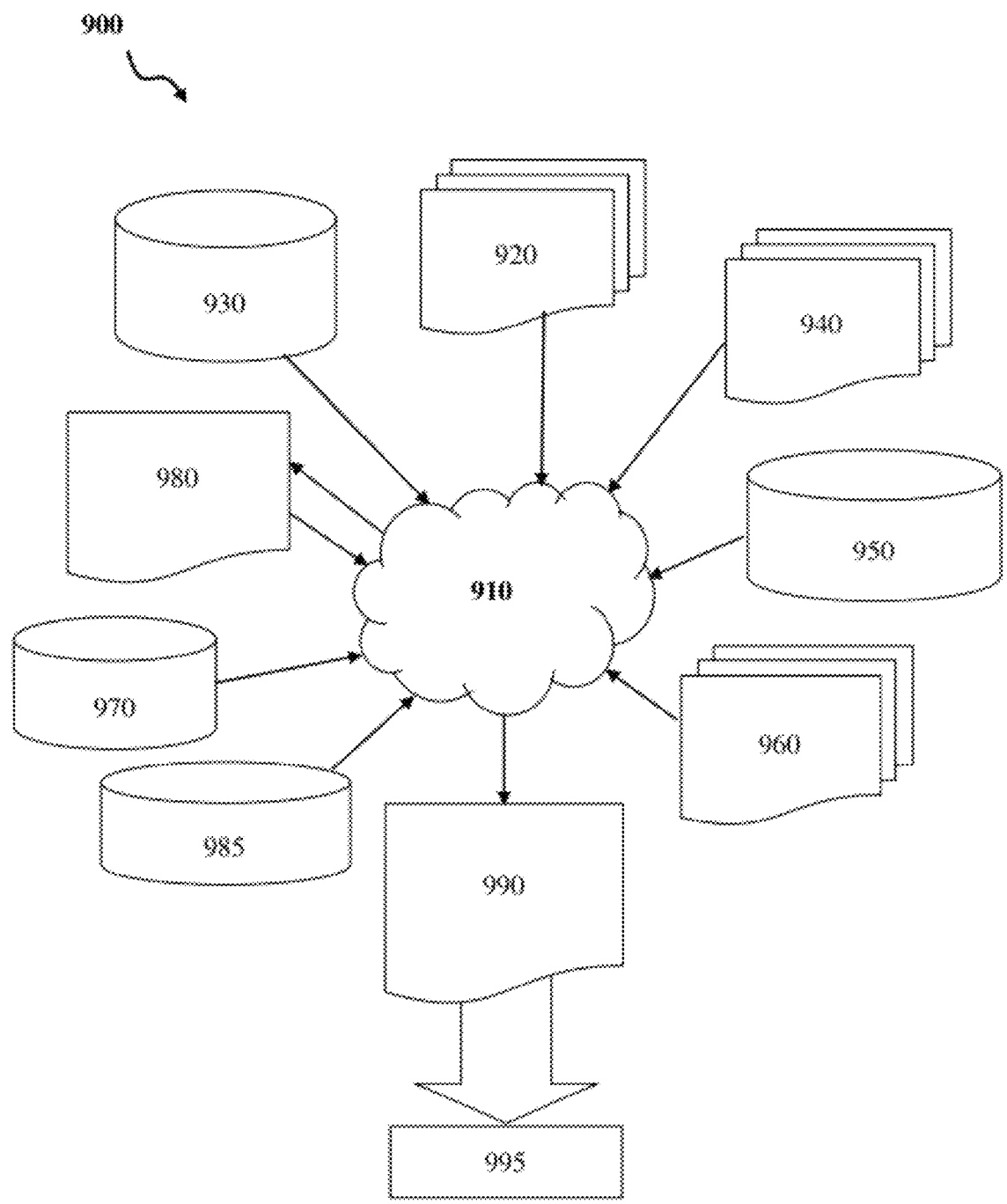
FIG. 9 is a flow diagram of a design process used in semiconductor design, manufacture, and/or test.

FIG. 9 is a flow diagram of a design process used in semiconductor design, manufacture, and/or test. FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 3-6. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 3-6. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 3-6 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 3-6. In one embodiment, design structure 990 may comprise a compiled, executable HDL simulation model that functionally simulates the devices shown in FIGS. 3-6.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 3-6. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A semiconductor structure comprising:
    a power gated circuit that comprises a group of power gate switches;
    an alternating enable generator that generates enabling signals;
    a counter that outputs a count signal in response to receiving a gate enable signal indicative of each power-on cycle of the power gated circuit;
    a demultiplexer that outputs demultiplexer signals in response to receiving the gate enable signal and the count signal; and
    an alternate logic that outputs the enabling signals in response to receiving the gate enable signal and the demultiplexer signals,
    wherein each respective one of the power gate switches is enabled by a respective one of the enabling signals; and
    wherein the alternating generator generates the enabling signals such that a first enabled power gate switch for each power on-cycle of the power gated circuit is alternated amongst the group of power gate switches.

2. The semiconductor structure of claim 1, wherein the alternating enable generator comprises the counter, the demultiplexer, and the alternate logic.

3. The semiconductor structure of claim 1, wherein:
    the demultiplexer outputs a group of the demultiplexer signals in response to receiving the counter signal and the gate enable signal; and
    an alternating one of the demultiplexer signals in the group of the demultiplexer signals is output as a high signal for each power-on cycle.

4. The semiconductor structure of claim 3, wherein:
the alternate logic comprises a group of gates associated with each power gate switch in the group of power gate switches; and
each group of gates outputs a respective one of the enabling signals to enable the corresponding power gate switch in response to receiving the gate enable signal and a demultiplexer signal from the group of demultiplexer signals.

5. The semiconductor structure of claim 4, wherein a respective one of the group of gates that receives the high signal outputs the enabling signal first such that the corresponding power gate switch that is enabled first is alternated.

6. A power gated cell circuit comprising:
a global power supply;
at least one group of power gate switches connected to the global power supply;
an internal power supply bus connected to the at least one group of power gate switches; and
an alternating enable generator comprising:
  a counter that:
    receives a gate enable signal indicative of each power-on cycle of the power gated cell circuit, and
    outputs a counter signal;
  a demultiplexer that:
    receives the counter signal and the gate enable signal, and
    outputs a group of demultiplexer signals, and a different one of the demultiplexer signals in the group of demultiplexer signals is output as a high signal for each power-on cycle based on the counter signal and the gate enable signal received; and
  alternate logic connected to the at least one group of power gate switches, the alternate logic:
    receives the group of demultiplexer signals and the gate enable signal, and
    outputs a group of enabling signals to the at least one group of power gate switches, and a different one of the enabling signals of the group of enabling signals is output first based on the different one of the demultiplexer signals output as the high signal and the gate enable signal received,
wherein a first power gate switch of the at least one group of power gate switches is enabled first based on the different one of the enabling signals that is output first, and the first power gate switch is alternated for each power-on cycle based on a combination of the counter signal and the gate enable signal.

7. The power gated cell circuit of claim 6, wherein:
the alternate logic further comprises:
  a first group of gates for a first power gate switch in the at least one group of power gates, and
  a second group of gates for a second power gate switch in the at least one group of power gates; and
the first group of gates comprises at least two AND gates connected to at least one OR gate, and
the second group of gates comprises at least two AND gates connected to at least one OR gate.

8. The power gated cell circuit of claim 7, wherein:
each of the at least two AND gates of the first group of gates receives the gate enable signal indicative of a first power-on cycle;
one of the at least two AND gates of the first group of gates receives the different one of the demultiplexer signals output as the high signal;
the one of the at least two AND gates of the first group of gates that receives both the gate enable signal and the different one of the demultiplexer signals output as the high signal also outputs a high signal to the OR gate of the first group of gates connected to the one of the at least two AND gates; and
the OR gate of the first group of gates connected to the one of the at least two AND gates outputs the different one of the enabling signals of the group of enabling signals to the first power gate switch and to at least one of the AND gates of the second group of gates.

9. The power gated cell circuit of claim 8, wherein:
each of the at least two AND gates of the second group of gates receives the gate enable signal indicative of a second power-on cycle;
one of the at least two AND gates of the second group of gates receives the different one of the demultiplexer signals output as the high signal;
the one of the at least two AND gates of the second group of gates that receives both the gate enable signal and the different one of the demultiplexer signals output as the high signal also outputs a high signal to the OR gate of the second group of gates connected to the one of the at least two AND gates; and
the OR gate of the second group of gates connected to the one of the at least two AND gates outputs the different one of the enabling signals of the group of enabling signals to a second power gate switch.

10. The power gated cell circuit of claim 8, wherein:
at least one of the AND gates of the second group receives the different one of the enabling signals of the group of enabling signals and output a high signal to the at least one OR gate of the second group of gates; and
the at least one OR gate of the second group of gates receives the high signal from the at least one of the AND gates of the second group and output an enabling signal of the group of enabling signal, which is delayed a predetermined amount of time from the different one of the enabling signals of the group of enabling signals in order to enable a second power gate switch the predetermined amount of time from the first power gate switch.

11. A method of controlling alternate power gating, comprising:
outputting a gate enable signal indicative of each power-on cycle of a power gate cell circuit:
outputting a counter signal;
outputting enabling signals such that each power gate switch of a group of power gate switches is enabled by a different enabling signal; and
receiving the enabling signals such that a different power gate switch of the group of power gate switches is enabled first after each power-on cycle of the power gate cell circuit,
wherein the counter signal increments each time the gate enable signal is received.

12. The method of claim 11, further comprising outputting a group of demultiplexer signals based on the gate enable signal and the counter signal.

13. The method of claim 12, wherein a different demultiplexer signal of the group of demultiplexer signals is output as a high signal based on the incremented counter signal received.

14. The method of claim 13, further comprising outputting the enabling signals based on the gate enable signal and the group of demultiplexer signals.

15. The method of claim 14, wherein the demultiplexer signal outputted as the high signal causes a different enabling signal of the enabling signals to be outputted first.

16. The method of claim 15, wherein the enabling signal outputted first causes the different power gate switch to be enabled first after each power-on cycle of the power gate cell circuit.

17. The method of claim 16, wherein each power gate switch of the group of power gate switches is enabled sequentially with a predetermined period of delay between each enablement.

18. The method of claim 11, wherein the enabling signals are output by an alternating enable generator.

* * * * *